United States Patent [19]
Miyashita

[11] Patent Number: 5,980,195
[45] Date of Patent: Nov. 9, 1999

[54] POSITIONING APPARATUS FOR SUBSTRATES TO BE PROCESSED

[75] Inventor: Masahiro Miyashita, Yokohama, Japan

[73] Assignee: Tokyo Electron, Ltd., Tokyo, Japan

[21] Appl. No.: 08/847,721

[22] Filed: Apr. 22, 1997

[30] Foreign Application Priority Data

Apr. 24, 1996 [JP] Japan ................................. 8-127774
May 13, 1996 [JP] Japan ................................. 8-142274

[51] Int. Cl.$^6$ .................................................. B65G 49/07
[52] U.S. Cl. ......................... 414/783; 414/936; 414/941; 414/938
[58] Field of Search ................................ 414/783, 936, 414/937, 938, 939, 941

[56] References Cited

U.S. PATENT DOCUMENTS

| | | | |
|---|---|---|---|
| 5,162,047 | 11/1992 | Wada | 414/937 |
| 5,445,486 | 8/1995 | Kitayama et al. | 414/937 |
| 5,479,108 | 12/1995 | Cheng | 414/941 |
| 5,549,444 | 8/1996 | Dubuit | 414/941 |
| 5,565,034 | 10/1996 | Nanbu et al. | 414/937 |
| 5,636,964 | 6/1997 | Somekh et al. | 414/941 |
| 5,647,626 | 7/1997 | Chen et al. | 414/937 |
| 5,655,871 | 8/1997 | Ishii et al. | 414/941 |
| 5,669,644 | 9/1997 | Kaihotsu et al. | 414/941 |
| 5,669,752 | 9/1997 | Moon | 414/941 |
| 5,700,046 | 12/1997 | Van Doren et al. | 414/941 |
| 5,711,646 | 1/1998 | Ueda et al. | 414/937 |
| 5,711,647 | 1/1998 | Slocum | 414/941 |
| 5,851,102 | 12/1998 | Okawa et al. | 414/783 |

FOREIGN PATENT DOCUMENTS

| | | | |
|---|---|---|---|
| 0 506 044 | 9/1992 | European Pat. Off. | 414/937 |
| 60-85536 | 5/1985 | Japan . | |
| 1-28503 | 6/1989 | Japan . | |

Primary Examiner—Christopher P. Ellis
Assistant Examiner—Douglas Hess
Attorney, Agent, or Firm—Smith, Gambrell & Russell, LLP

[57] ABSTRACT

An apparatus is provided with a plurality of stages of mounting bases on each of which is disposed upwardly orientated, narrow tapered pins around the periphery of a semiconductor wafer, and a plurality of stages of turntables, one for each of the mounting bases, with the mounting bases being capable of moving independently of the turntables. When a wafer is transferred from a transporter arm to the tapered pins, the peripheral edge of the wafer comes into contact with the inner peripheral surfaces of the tapered pins and the wafer is centered thereby. The turntable then picks up the wafer and aligns the orientation thereof. This makes it possible to position the centers of a plurality of wafers and position the orientations thereof in a simple manner.

7 Claims, 15 Drawing Sheets

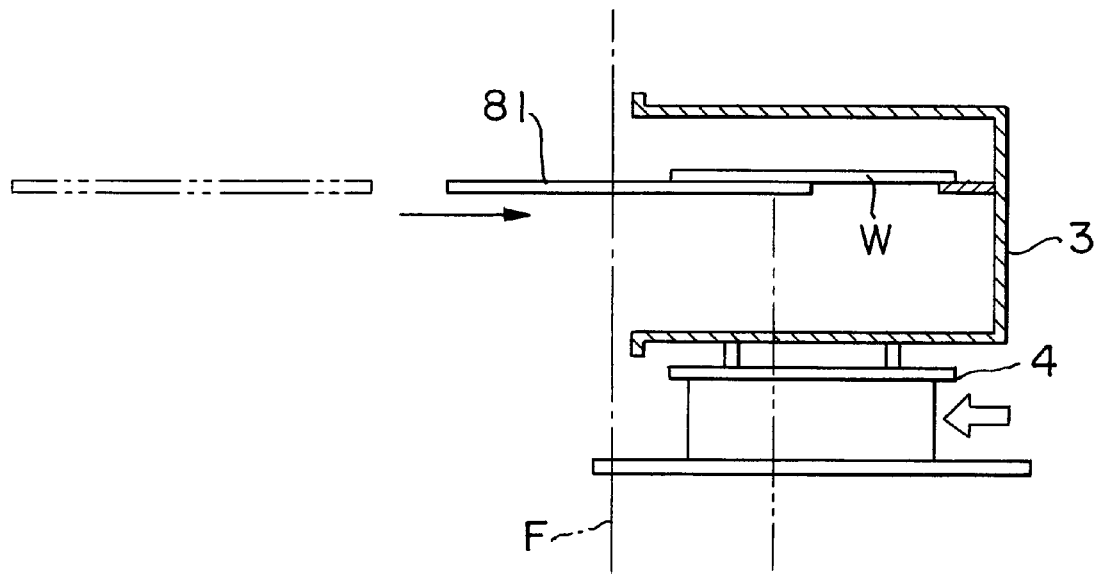
F I G. 7 (a)
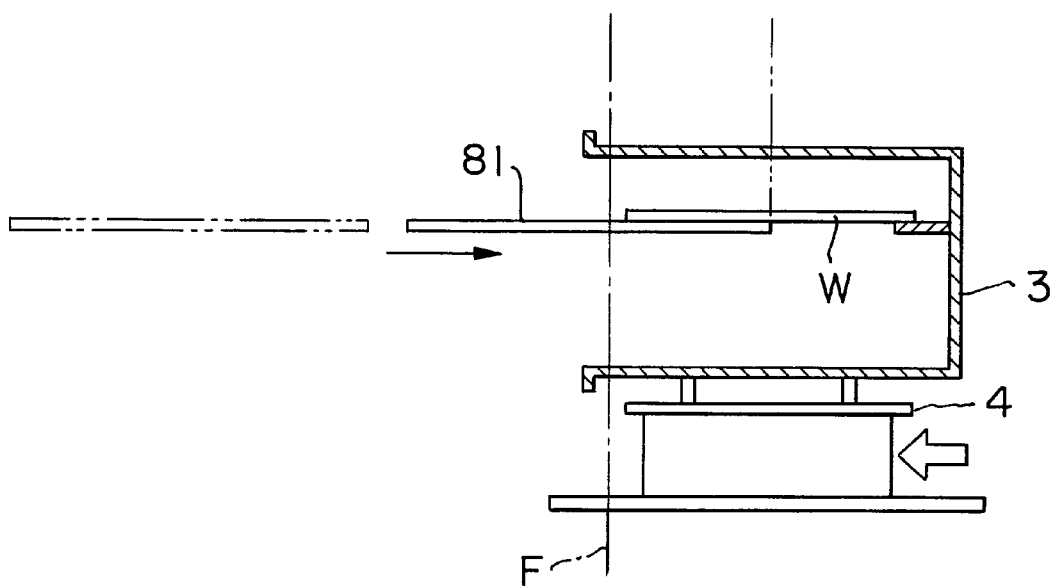
F I G. 7 (b)

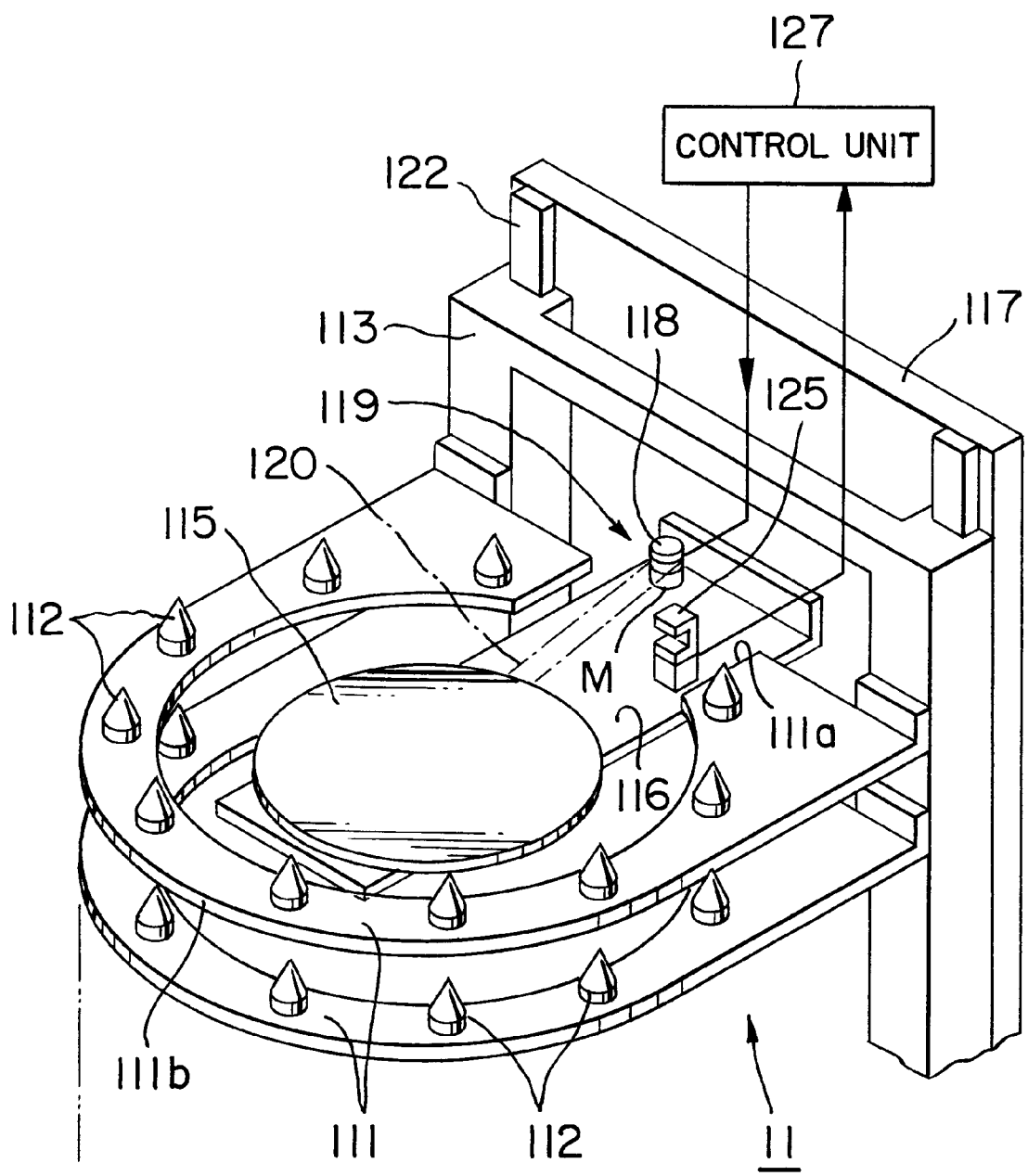
F I G. 9

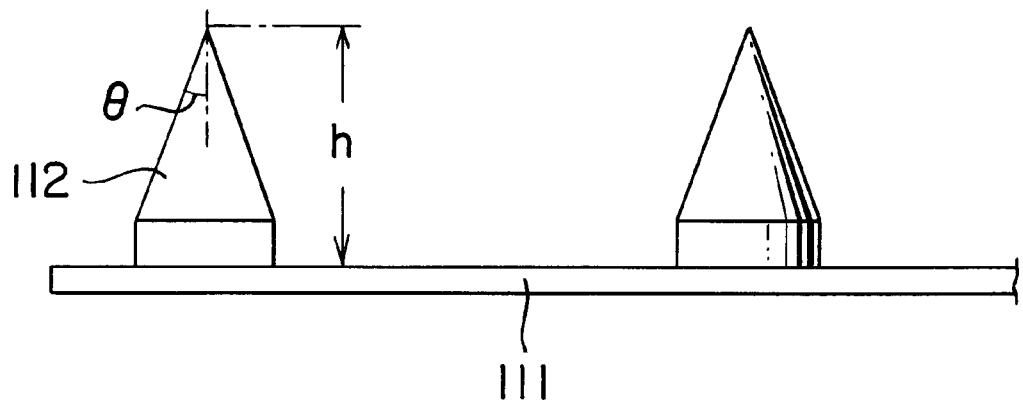
F I G. 11
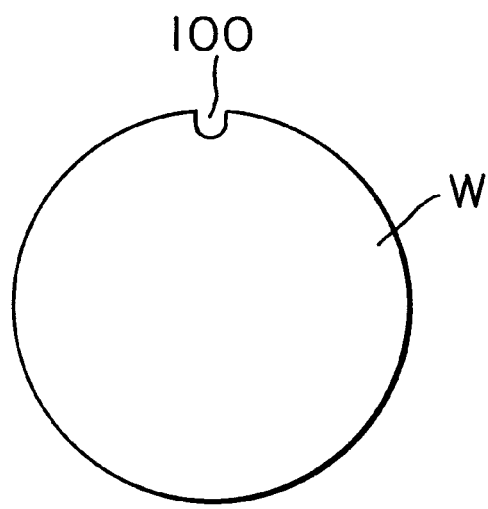 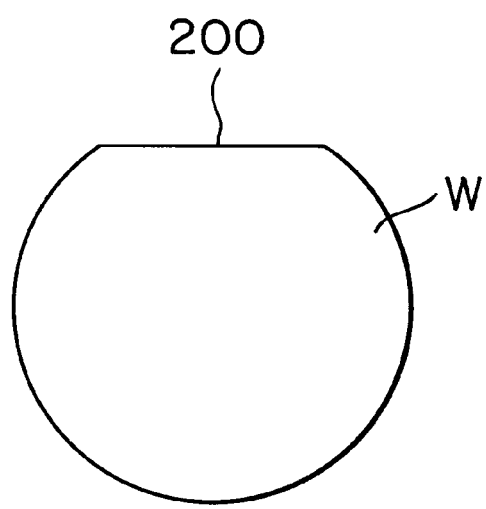
F I G. 12   F I G. 13

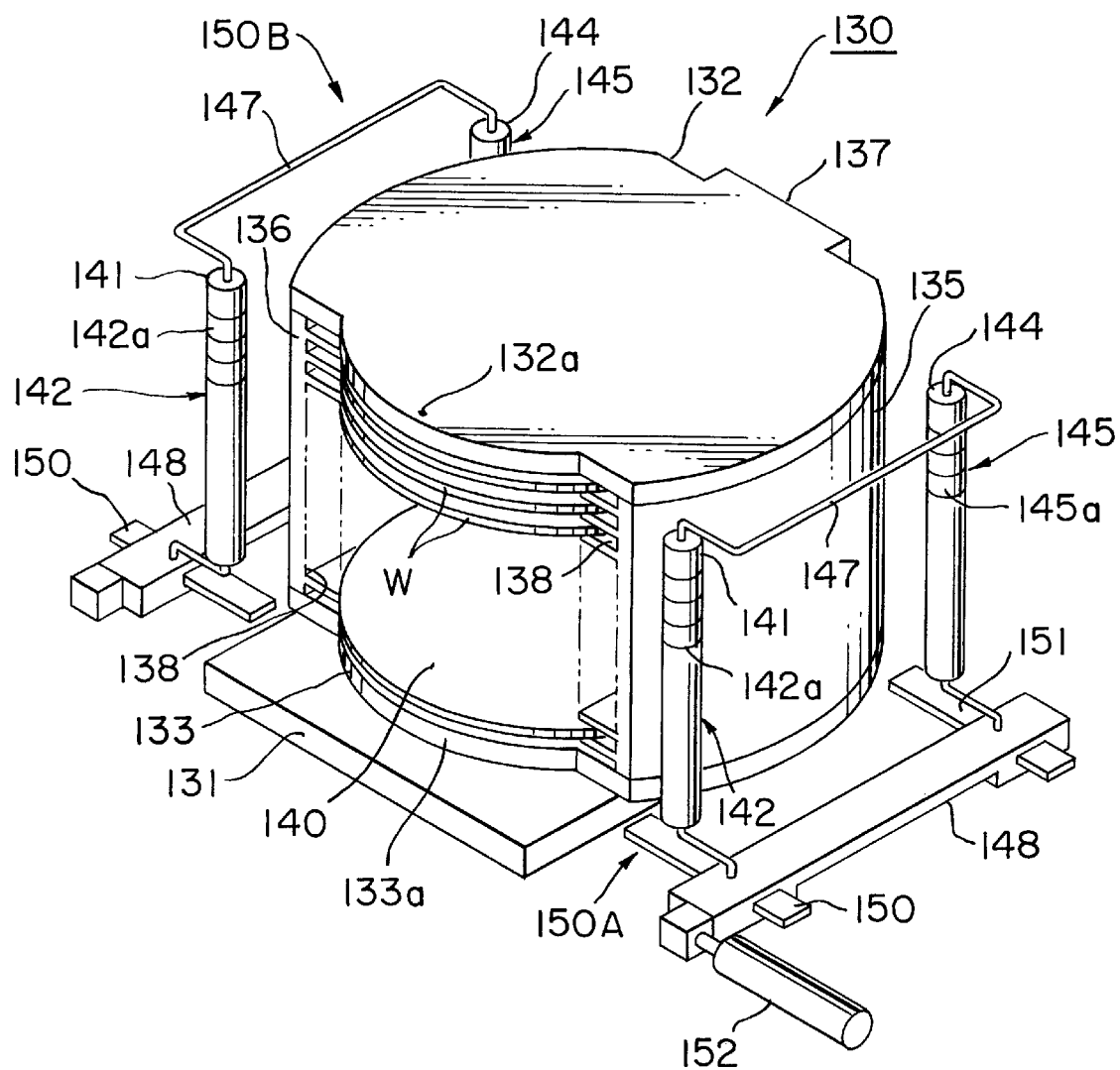
F I G. 16

POSITIONING APPARATUS FOR SUBSTRATES TO BE PROCESSED

The present invention relates to an apparatus for positioning a substrate to be processed such as a semiconductor wafer and, in particular, to a positioning apparatus for aligning a center and/or a rotational position of a substrate to be processed.

BACKGROUND OF THE INVENTION

In general, when a semiconductor wafer is to be processed or inspected, the orientation of the wafer must be aligned to take account of the directionality of the crystal of the wafer. For that reason, a simple method is known of forming a linear cut-out portion called an orientation flat in the wafer, to be used when the orientation flat is aligned by rollers.

This use of rollers in this manner to position the orientation flat enables wafers to be aligned in a batch while still accommodated within a cassette, and such a mechanism is used at a heat treatment station that performs a heat treatment on a batch of wafers, for example, with a cassette placed vertically to position the wafers. When a process such as ion implantation or patterning is performed on wafers, however, the wafers must be accurately placed with respect to the ion implantation region or exposure region, and thus it is necessary to center the wafers as well.

Techniques are known in the prior art as methods of positioning the orientation (the direction of the orientation flats) and the centers of the wafers, such as a technique disclosed in Japanese Patent Application Laid-Open No. 60-85536, of aligning the orientation of a wafer by a turntable and also moving that turntable in the X and Y directions to position the center thereof in a general manner, or a technique disclosed in Japanese Patent Publication No. 1-28503 of orientating a wafer on a stage by rollers and then moving that stage in the X and Y directions.

Since it is wasteful to form an orientation flat in a wafer and thus cut out a wide area thereof, a method that has recently been investigated involves forming a semicircular cut-out portion called a notch instead of a orientation flat in the peripheral edge of a wafer, and thus a mechanism that uses rollers to position wafers within a cassette cannot be applied thereto without changes.

In addition, a sealable wafer cassette has been investigated as means of suppressing contamination of the wafers by particles, but in such a case it is not possible to position the wafers within the cassette. The wafers have to be removed from the cassette for positioning, but since a plurality of wafers, such as five wafers, have to be moved at a time into a wafer boat at a heat treatment station that performs a heat treatment on a batch of wafers, for example, the previously described method of placing wafers one-by-one on a turntable would reduce the throughput.

The previously mentioned method that uses a turntable to center a wafer necessitates X-direction and Y-direction drive mechanisms and moreover the amounts of drive thereof must be accurate, so that the cost is increased by this increase in mechanical complexity. A sealed type of wafer cassette that is designed to suppress the contamination of wafers by particles is provided with a main cassette body, which accommodates a number of wafers (such as 13 wafers), and a lid member for hermetically closing a wafer transfer port formed in the main cassette body with an O-ring therebetween. The configuration is such that the lid member is locked by, for example, the insertion of keys into the lid member, whereby it is fixed to the main cassette body.

To reduce the contamination of the wafers by particles in this case, it is preferable to partition a cassette mounting region for placing the wafer cassette from a wafer transportation region, and keep the degree of cleanliness of the cassette mounting region higher than that of the wafer transportation region. The cassette mounting region will be referred to as a first environment and the wafer transportation region will be referred to as a second environment. In one method of increasing the cleanliness of the first environment that can be considered, the first environment and the second environment are separated by a partitioning wall, the wafer cassette is attached from the first environment side to an aperture formed in the partitioning wall, and the wafers within the wafer cassette are removed toward the second environment side.

With the above-described configuration for attaching a wafer cassette, the various components are constructed in such a manner that a gap on the order of approximately 2 mm is formed between the wafer cassette and the partitioning wall at the peripheral edge portion of the aperture when the wafer cassette has been attached to the aperture in the partitioning wall. Since the pressure in the second environment is set to be higher than that in the first environment, clean air always flows into the first environment through this gap, and thus particles are prevented from penetrating from the first environment side into the second environment side.

However, the air flowing through this gap forms vortices. In the vicinity of the surfaces that define the gap, such as those of the partitioning wall and the wafer cassette, the air is extremely gentle with a velocity close to zero. Thus the air on the first environment side is entrained into the vortices of the air flowing from the second environment, so that it flows along the above surfaces into the second environment side. This causes particles to penetrate into the second environment together with the air and thus, although great care has been taken to use sealed cassettes to prevent contamination of the wafers by particles, that intention is counteracted. In addition, if the region used for transferring wafers into a wafer boat is made to be a nitrogen environment, for example, it becomes difficult to manage the oxygen density within a processing region of an apparatus designed to prevent the growth of natural oxides.

A sealed type of wafer cassette makes it impossible to position the wafers in the cassette, thus making it necessary to position the wafers after they have been removed from the wafer cassette. The exchange of wafer cassettes involves attaching the lid member to the current wafer cassette, removing the wafer cassette from the partitioning wall, and attaching a new wafer cassette to the aperture in the partitioning wall. The removal and attachment of the lid member and the removal and attachment of the wafer cassettes themselves are time-consuming processes, so that the exchange of wafer cassettes takes a long time. Therefore, since the incorporation of a system that uses a sealed type of wafer cassette makes it necessary to add the time required for positioning the wafers and the time required for exchanging the wafer cassettes, there are demands for the investigation of techniques preventing any deterioration in throughput.

SUMMARY OF THE INVENTION

The present invention was devised in the light of these problems in the prior art and has as an object thereof the provision of a positioning apparatus that enables simple alignment of the center and/or the orientation of a substrate to be processed, such as a wafer.

Another object of the present invention is to provide a positioning apparatus that enables alignment of the center and/or the orientation of a plurality of substrates to be processed at a time.

A further object of the present invention is to provide a positioning apparatus that enables centering of a substrate to be processed within a cassette for substrates to be processed.

A still further object of the present invention is to provide an apparatus for transporting a substrate to be processed that suppresses any decrease in the cleanliness of a region in which the substrate to be processed is mounted, when a sealed type of cassette for substrates to be processed is used to transport the substrate to be processed.

A yet further object of the present invention is to provide an apparatus for transporting a substrate to be processed which is capable of improving throughput when a sealed type of cassette for substrates to be processed is used to transport the substrate to be processed.

The present invention provides in one aspect thereof an apparatus for aligning a central position and a rotational position of a substrate to be processed, where the substrate has a peripheral edge forming a circle and a cut-out portion for rotational position detection formed in the peripheral edge; wherein the apparatus comprises a turntable which is rotatable about a vertical rotational axis and which has an upper surface on which a substrate to be processed is mounted; detection means for detecting the cut-out portion of the substrate that is mounted on and rotating with the turntable; control means for controlling an amount of rotation of the turntable in accordance with a detection signal from the detection means, to align the rotational position of the substrate to be processed; a horizontal base for receiving a substrate to be processed; and inclined guide means rising from an upper surface of the base and provided along a circular peripheral edge of the substrate to be processed, the guide means being mounted on the base, in such a manner that the peripheral edge of the mounted substrate to be processed comes into contact therewith and is guided thereby; the guide means comprising a taper that is inclined in such a manner as to separate from the substrate to be processed with increasing upward distance.

The present invention provides in another aspect thereof an apparatus for positioning a substrate to be processed, comprising support means for supporting a plurality of substrates to be processed at intervals in a vertical direction; and pushing means provided outside the support means for pushing outer peripheral edges of substrates to be processed that are exposed from the support means, from the outside in at least three locations, to position the substrates to be processed.

The present invention provides in a further aspect thereof a transporting apparatus for a substrate to be processed, comprising a partitioning wall for demarcating a first environment from a second environment, and having an aperture for transfer of a substrate to be processed; a sealed type of cassette for substrates to be processed, comprising a main cassette body having an aperture through which a substrate to be processed enters or exits and a lid member for closing the aperture of the main cassette body; cassette mounting means provided within the first environment, for supporting the cassette in such a manner that the aperture for substrates to be processed is aligned with the transfer aperture of the partitioning wall; sealing means for forming a seal between the peripheral edge of the transfer aperture of the partitioning wall and the peripheral edge of the aperture of the main cassette body, to hermetically demarcate a space within the cassette from the first environment; means for positioning a substrate to be processed, provided within the second environment; a substrate transporting mechanism provided within the second environment; a lid member for the partitioning wall for closing the transfer aperture of the partitioning wall in an openable manner; first opening/closing means for opening or closing the partitioning wall lid member; and second opening/closing means for opening or closing a lid member of the cassette.

BRIEF DESCRIPTION OF THE DRAWINGS

FIGS. 7(i a) and 7(b) are views illustrative of the operation of the apparatus of FIG. 6;

FIG. 9 is an enlarged perspective view of part of FIG. 8;

FIG. 11 is a side view of tapered pins of the positioning apparatus, shown enlarged;

FIGS. 12 and 13 are plan views of different types of wafer;

FIG. 16 is a perspective view of yet another embodiment of the positioning apparatus.

DESCRIPTION OF THE PREFERRED EMBODIMENTS

Figure 1:
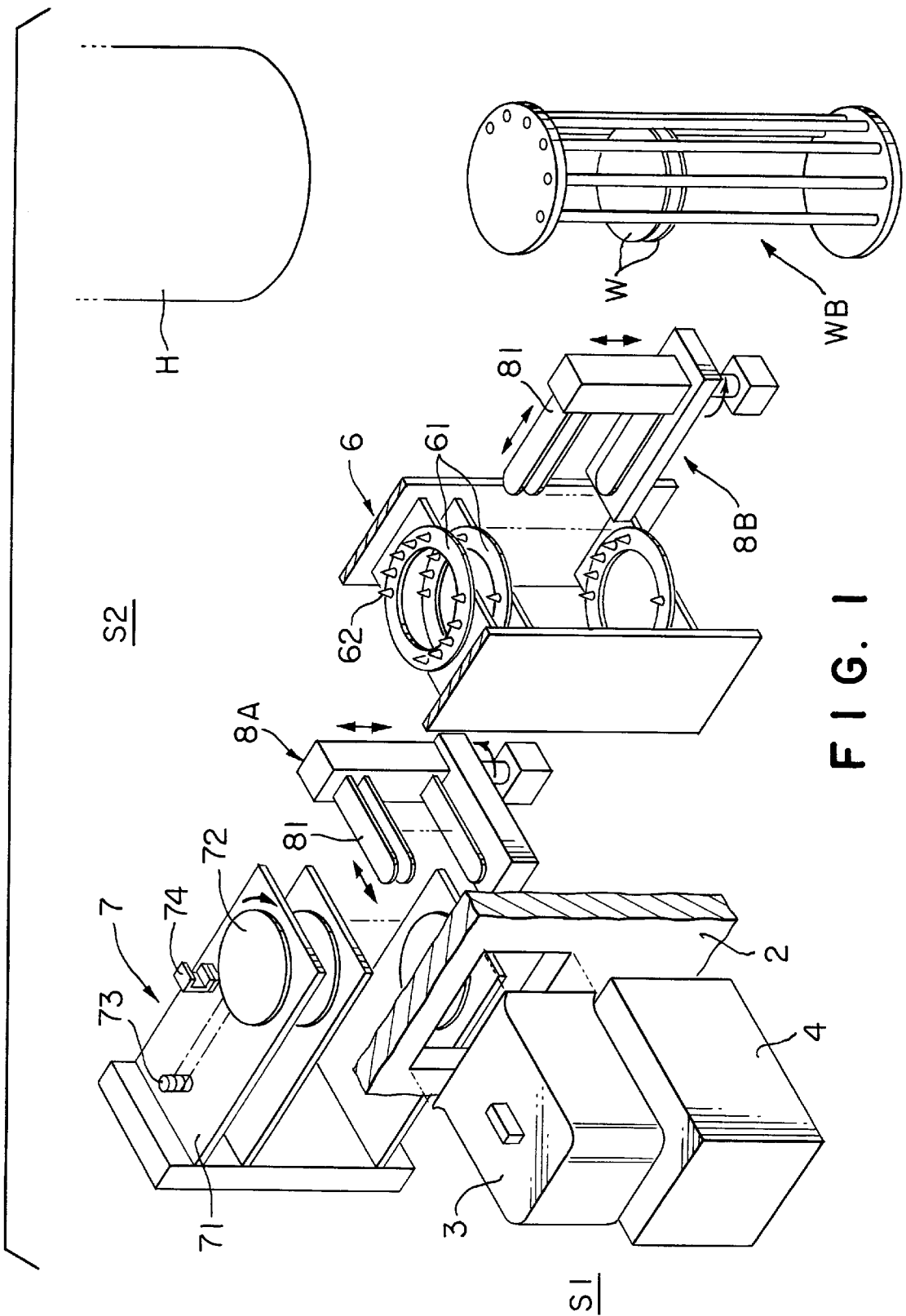
FIG. 1 is a schematic perspective view of a substrate transporter apparatus provided with an apparatus for positioning a substrate to be processed in accordance with this invention.
Figure 2:
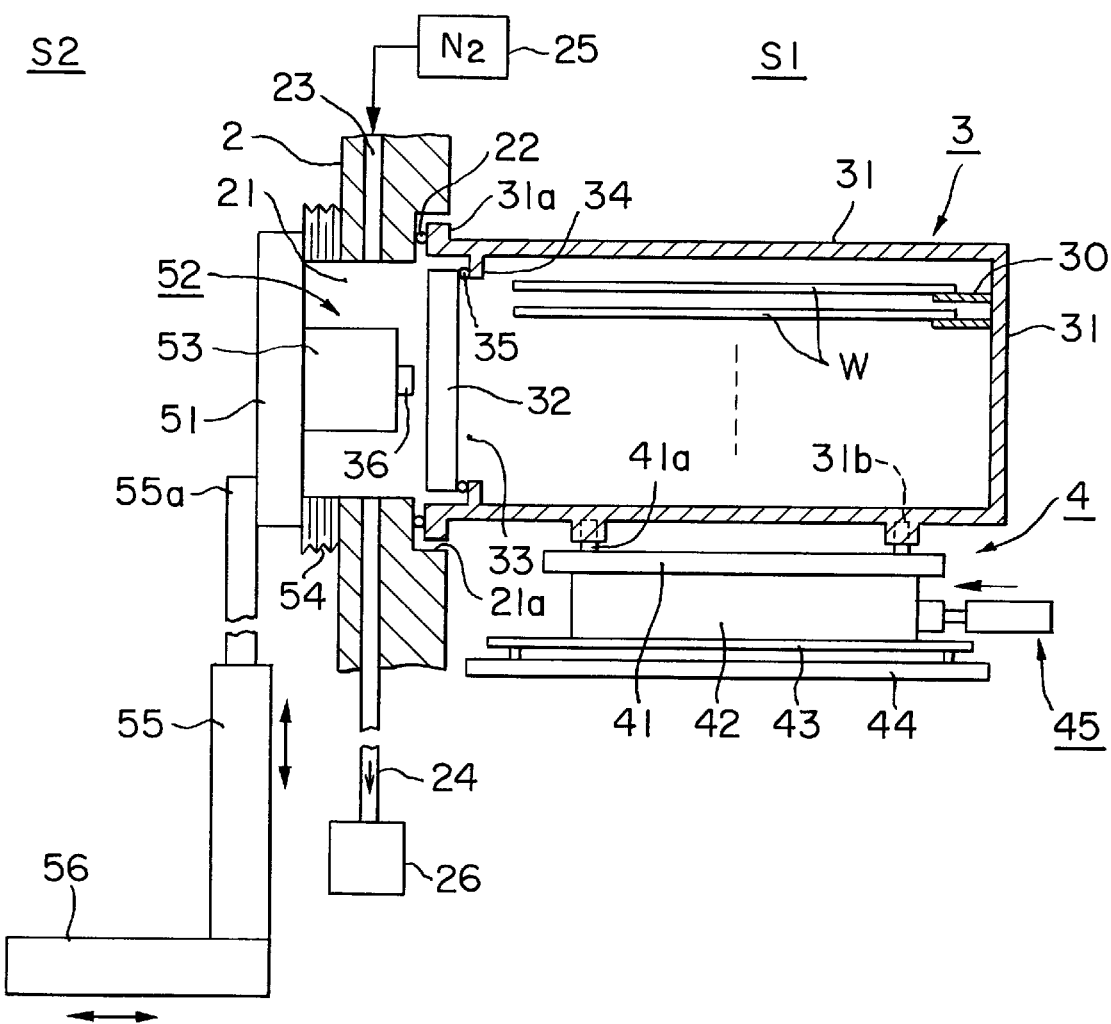
FIG. 2 is a cross-sectional view, mainly of the components of a wafer cassette shown in FIG. 1.

A representative embodiment of the present invention is shown in FIG. 1 and a section through a main portion thereof is shown in FIG. 2. This device is demarcated by a partitioning wall 2 to form a first environment S1 that is a wafer cassette mounting region and a second environment S2 that is a wafer transportation region. An aperture 21 for the transfer of wafers, which are substrates to be processed, is formed in this partitioning wall 2 as shown in FIG. 2, and a step portion 21a is formed around a peripheral edge portion on the first environment S1 side of the aperture portion 21.

An O-ring 22 formed of a resilient material such as Teflon (tradename) is provided on a step surface of the step portion 21a (hereinafter called a surface facing an attachment/removal direction), to form a sealing portion. This O-ring 22 is designed to provide a seal between a peripheral edge portion of a wafer cassette 3 and the aperture 21 of the partitioning wall 2, thus hermetically separating the first environment S1 from a space within the wafer cassette 3. A nitrogen (N2) gas supply passage 23 and an exhaust passage 24 are provided in such a manner as to open into an inner peripheral surface of the partitioning wall 2 surrounding the aperture 21, and a N2 gas source 25 and a vacuum pump 26 are connected to the other ends of the N2 gas supply passage 23 and exhaust passage 24, respectively.

The sealed wafer cassette 3, which is a cassette for substrates to be processed, is hermetically attached to the partitioning wall 2 on the first environment S1 side of the aperture 21. This wafer cassette 3 is provided with a main cassette body 31 in which are formed multiple stages of wafer holder portions 30 in such a manner that a number of wafers W (for example, 13 wafers), which are substrates to be processed, are supported vertically at a certain spacing thereby, and a lid member 32 for hermetically sealing an aperture 33 that is a wafer transfer port of this main cassette body 31, as shown by way of example in FIG. 3.

Figure 3:
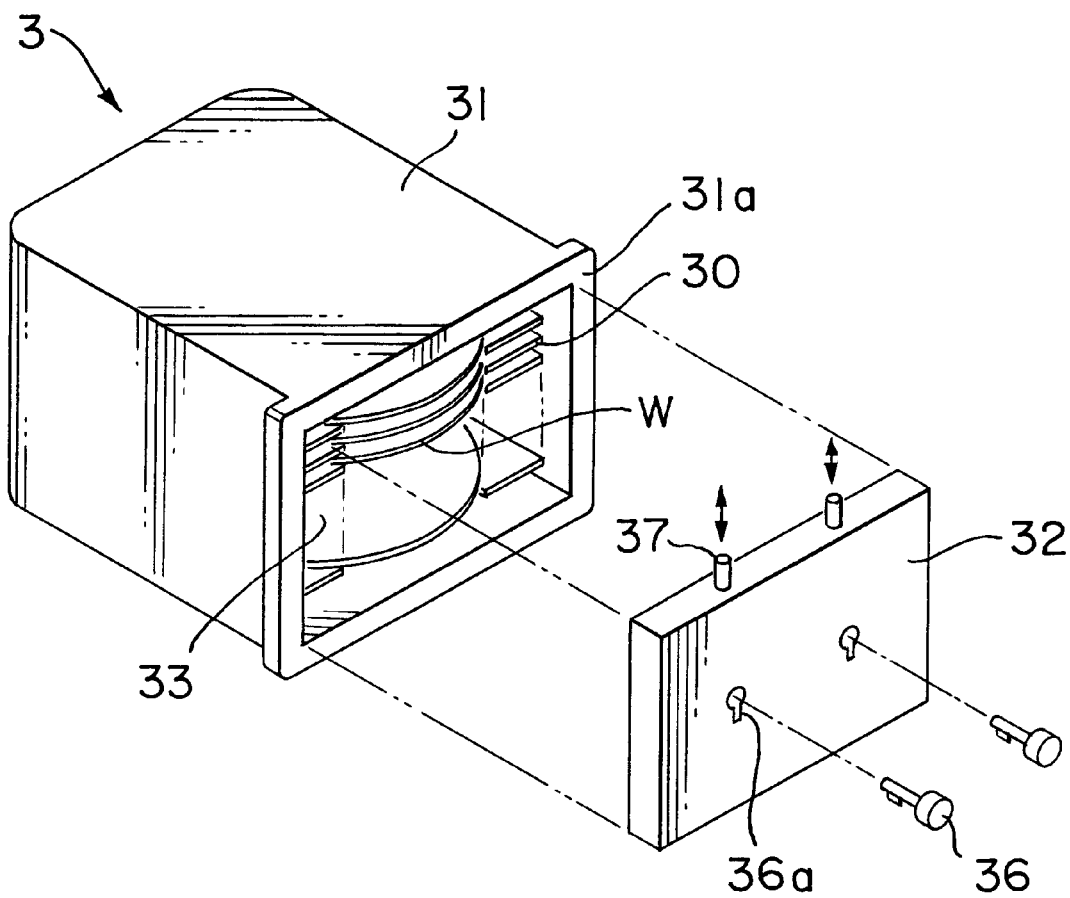
FIG. 3 is a perspective view of the wafer cassette.

The lid member 32 is provided in such a manner that it enters within the aperture 33 of the main cassette body 31, a protruding portion 34 that acts as a stopper for the lid member 32 is formed around the inner peripheral surface of the main cassette body 31, and an O-ring 35 is provided between the lid member 32 and the protruding portion 34, as shown in FIG. 2. As shown in FIG. 3, keyholes 36a are provided in, for example, two locations on the lid member 32 and the configuration is such that a number of locking pins 37 (for example, four pins) are forced outward from the upper and lower edges of the lid member 32 to fix together the main cassette body 31 and the lid member 32, by inserting keys 36 that are provided in a second opening mechanism (which will be described later) into the keyholes 36a and rotating the same. The peripheral edge portion of the aperture 33 of the main cassette body 31 is formed as a flange portion 31a with the outer side thereof being curved.

The wafer cassette 3 is mounted on a stage 41 (FIG. 2) of a cassette mounting portion 4, the wafer cassette 3 is supported by this cassette mounting portion 4 at a position aligned with the aperture 21 for the transfer of wafers, and is attached to the aperture 21 for the transfer of wafers in such a manner that the flange surface of the flange portion 31a is placed in hermetic contact with the step surface of the step portion 21a of the aperture portion 21 for the transfer of wafers, with the O-ring 22 therebetween. For the sake of convenience, the partitioning wall 2 and the cassette mounting portion 4 are drawn in FIG. 1 displaced to the left from their normal positions, but in practice these components are positioned towards the side of a first transporter mechanism 8A, which will be described later.

The cassette mounting portion 4 is provided with the stage 41 on which are formed a number of protrusions 41a (for example, four protrusions), a stage-supporting stand 42 for supporting the stage 41, and guide rails 43 provided on a base 44 in a direction in which the wafer cassette 3 is attached and removed. The stage-supporting stand 42 is configured to be capable of moving along the guide rails 43 in this attachment/removal direction of the wafer cassette 3.

Indentations 31b are formed in a lower surface of the wafer cassette 3 to match the protrusions 41a of the stage 41, with the configuration being such that the wafer cassette 3 is positioned on the stage 41 by the engagement of the indentations 31b with the protrusions 41a. A pushing mechanism 45 such as an air cylinder, for pressing the stage-supporting stand 42 towards the partitioning wall 2 side, is provided on a rearward side (opposite to the second environment S2) of the stage-supporting stand 42.

Figure 4:
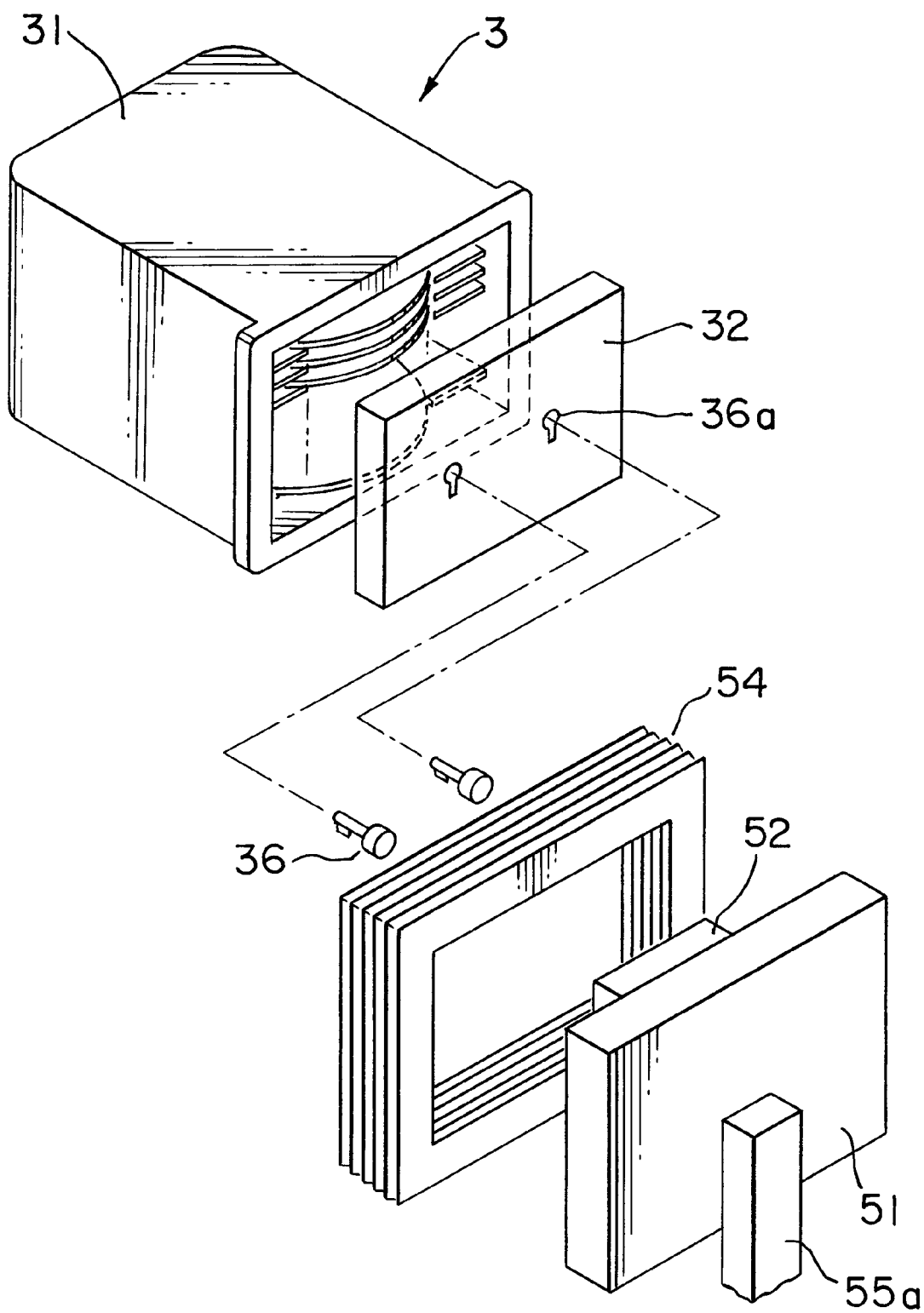
FIG. 4 is a perspective view of the wafer cassette, sealing member, second opening mechanism, and lid member for the wall.

A lid member 51 for the partitioning wall 2, for hermetically closing the second environment S2 side of the aperture portion 21 for the transfer of wafers, is provided on the second environment S2 side of the aperture portion 21 of the partitioning wall 2, as shown by way of example in FIG. 4. This lid member 51 is formed to be of a size that covers the peripheral edge portion of the aperture 21 on the second environment S2 side and is configured to be opened and closed by a first opening mechanism. This first opening mechanism is provided with an elevator base 55 for raising and lowering the lid member 51 by an elevator shaft 55a, and a horizontal base 56 for causing the elevator base 55 to move horizontally.

A second opening mechanism 52 for opening and closing the lid member 32 of the wafer cassette 3 is provided in combination with the lid member 51, and this second opening mechanism 52 has a key manipulation mechanism 53 (see FIG. 2) that moves the keys 36 forward and backward, and rotates them. A freely extendable bellows-like sealing member 54 is fixed by suction pads to the peripheral edge portion of the aperture 21 on the second environment S2 side in such a manner as to hermetically close the peripheral edge portion of the wall lid member 51.

The mechanism for transporting and positioning the wafers in the second environment S2 will now be described with reference to FIG. 1. Within the second environment S2 are provided an intermediate transfer stand 6 for temporary placement of the wafers; a positioning mechanism 7 for positioning wafers disposed on a forward upper side thereof; a wafer boat WB or the like that forms part of a thermal processing station disposed on a rearward side of the intermediate transfer stand 6; the first transporter mechanism 8A for transferring wafers to and from the wafer cassette 3, the intermediate transfer stand 6, and the positioning mechanism 7; and a second transporter mechanism 8B for transferring wafers to and from the intermediate transfer stand 6 and the wafer boat WB.

The intermediate transfer stand 6 is combined with a mechanism for positioning the centers of the wafers W and is provided with mounting rings 61 for positioning the centers of the wafers, disposed in 65 stages so as to be capable of accommodating more wafers than those in one cassette (13 wafers), such as the contents of five cassettes. Each of the mounting rings 61 is provided with a number of conical tapered pins 62, such as ten pins, disposed symmetrically five on each side along positions corresponding to the periphery of the wafer W. Spaces for the insertion of the first transporter mechanism 8A and the second transporter mechanism 8B are formed between pairs of the tapered pins 62 at the forward and rearward sides.

The positioning mechanism 7 is provided with a plurality of fixed bases 71 (such as five). Each of these fixed bases 71 is provided with a turntable 72, which supports the rear surface of a wafer W and is rotated about a vertical axis by a drive portion 73, and an optical sensor 74 for detecting a notch or orientation flat of the wafer on the turntable 72. The positioning mechanism 7 controls the angle of rotation of the turntable 72 on the basis of a detection signal from the optical sensor 74, to align the wafer in a predetermined orientation.

Each of the first transporter mechanism 8A and the second transporter mechanism 8B is provided with, for example, five transporter arms 81 that are capable of transporting a plurality of wafers, such as five wafers, at a time or a single wafer at a time. These arms are configured to be freely movable forward/backward, vertically, and rotatably, and the pitch (vertical spacing) therebetween is also variable.

The operation of this embodiment will now be described. First of all, a wafer cassette 3 containing wafers W is mounted on the cassette mounting portion 4 and it is pushed by the pushing mechanism 45. This presses the flange surface of the flange portion 31a of the wafer cassette 3 against the step surface of the step portion 21a of the aperture 21 for the transfer of wafers, with the O-ring 22 therebetween, to form a hermetic seal between the first environment S1 and the second environment S2.

A pure inert gas such as N2 is then supplied from the N2 gas supply passage 23 into the space within the aperture 21 of the partitioning wall 2 (between the lid member 51 for the wall and the wafer cassette 3) while the pressure within the aperture 21 is reduced to, for example, 0.07 MPa by the vacuum pump 26 through the exhaust passage 24, to replace the air within that space with N2. The keys 36 of the key manipulation mechanism 53 of the second opening mechanism 52 are then inserted into the keyholes 36a of the lid member 32 of the wafer cassette 3 and rotated, whereby the locking pins 37 are released, closing the lid member 32.

Subsequently, the lid member 51 of the wall is moved backwards by the horizontal base 56 of the first opening mechanism, then is lowered by the elevator base 55, so that the lid member 51 for the wall is removed from the aperture 21, together with the lid member 32. The transporter arms 81 of the first transporter mechanism 8A are then inserted into the wafer cassette 3 to pick up and hold five wafers W from the wafer cassette 3 at a time and transport them into the intermediate transfer stand 6. At the intermediate transfer stand 6, each of the transporter arms 81 passes through the arm insertion space at the forward side of one of the mounting rings 61, and mounts the wafers W thereon in such a manner that the tapered surface of the tapered pins 62 of each mounting rings 61 comes into contact with the peripheral edge of a wafer W. Since this causes the peripheral edge of each wafer W to be controlled by the tapered surfaces of the tapered pins 62, the center of the wafer W is positioned.

After 13 wafers W have been transported in this manner from the wafer cassette 3 to the intermediate transfer stand 6, the aperture portion 21 for the transfer of wafers is closed by the lid member 51 for the wall. The empty wafer cassette 3 is then replaced by a new wafer cassette 3, but the positioning of wafers W and the transporting of the wafer boat can be done in the second environment S2 during this replacement.

Figure 5:
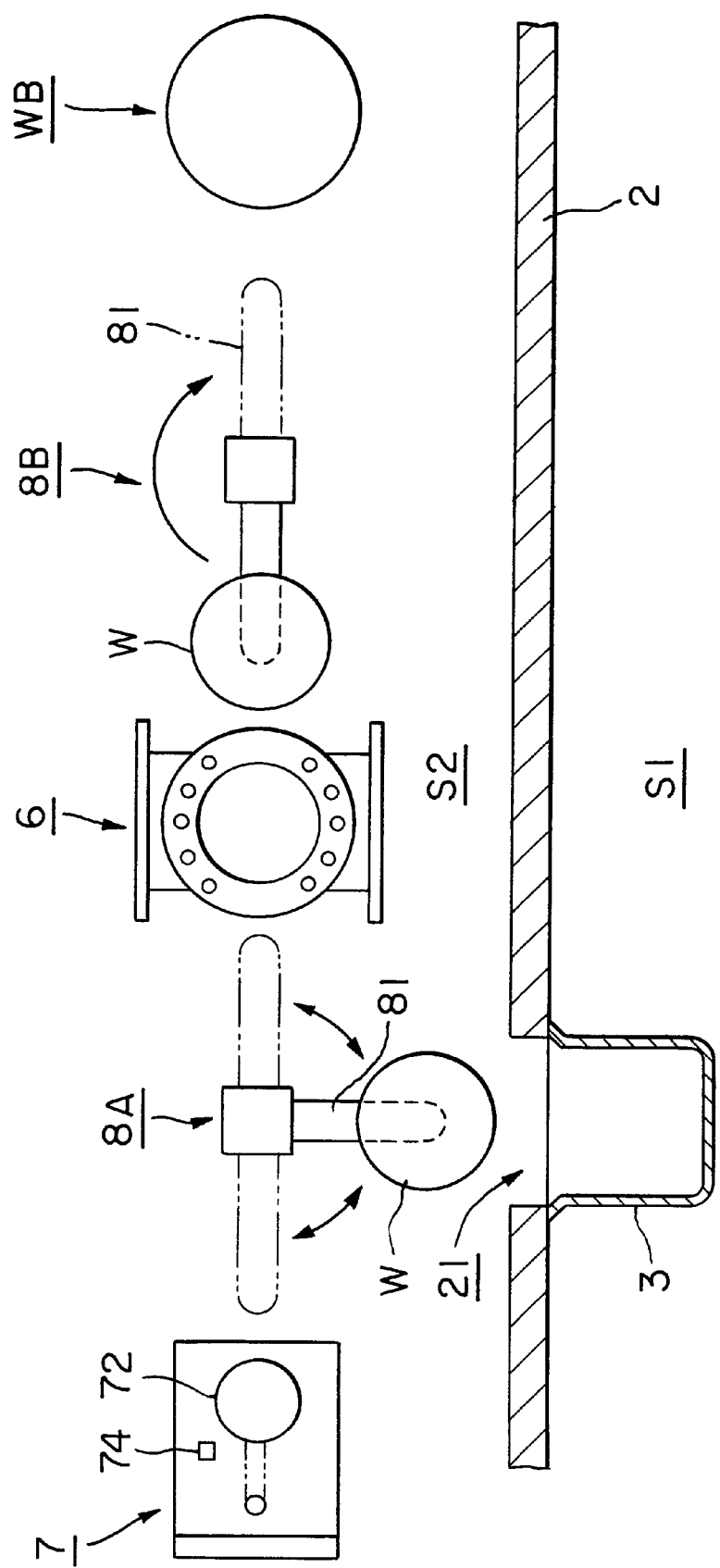
FIG. 5 is a plan view used to illustrate the operation of the wafer transporter apparatus.

In other words, the wafers W mounted on the intermediate transfer stand 6 are moved by the transporter arms 81 of the first transporter mechanism 8A onto the turntables 72 of the positioning mechanism 7 in the second environment S2, as shown in FIG. 5, and notches in the wafers W are positioned as previously described. Note that upwardly protruding pins (not shown in the figures) project from the upper surface of each turntable 72 of the positioning mechanism 7, and the wafers W are transferred onto these upwardly pointing pins.

After the wafers W on the positioning mechanism 7 have been transported by the first transporter mechanism 8A to the intermediate transfer stand 6, they are transported into the wafer boat WB from the intermediate transfer stand 6 by the transporter arms 81 of the second transporter mechanism 8B. This wafer boat WB is then inserted into a heat treatment furnace H (see FIG. 1) that is disposed above the wafer boat WB, for example, and a predetermined heat treatment is performed.

With this wafer transporter apparatus, the aperture 21 is closed by the lid member 51 for the wall when there is no wafer cassette 3 attached to the aperture 21 for the transfer of wafers of the partitioning wall 2. In addition, the space between the lid member 51 for the wall and the peripheral edge of the aperture 21 is sealed by the sealing member 54, so that the not-very-clean air of the first environment S1 is prevented from penetrating into the second environment S2.

After the wafer cassette 3 has been attached to the aperture 21, air from the first environment S1 does penetrate into the gap formed between the wafer cassette 3 in the aperture portion 21 and the lid member 51 for the wall, but this air is replaced with N2 by evacuating this gap while supplying N2 thereto, so that particles brought into this gap by the air are also removed through the exhaust passage 24.

For that reason, any decrease in the degree of cleanliness within the second environment S2 is suppressed because the first environment S1 is hermetically sealed from the second environment S2 by ensuring that the environment is very clean in the gap while the lid member 51 for the wall is open, and by placing the O-ring 22 between the wafer cassette 3 and the partitioning wall 2.

Furthermore, since a nitrogen environment is formed within the aperture portion 21 itself in this processing apparatus that creates a nitrogen environment within the second environment S2, there is substantially no danger of oxygen entering the second environment S2 and the second environment S2 can be made to be a predetermined nitrogen environment. Note that another inert gas such as argon, or very clean air, could equally well be used as the pure gas instead of N2.

In addition, since all of the wafers W within the wafer cassette 3 are first moved to a temporary position on the intermediate transfer stand 6 in the above-described wafer transporter apparatus, to create a state in which exchange can be performed while the wafer cassette 3 is empty, the task of exchanging wafer cassettes 3 can be performed in parallel. Therefore, the time taken for positioning the wafers W is not the sum of the time required for transporting the wafers and the time required for exchanging the wafer cassettes 3; it can be reduced to the time taken to convey the wafers from within the cassette 3 into the processing station. With a hermetically sealed type of wafer cassette 3, exchanging the wafer cassettes 3 takes a long time and the wafers W must be positioned after they have been fetched out of the wafer cassette 3, so this is an effective method from the viewpoint of the throughput in the subsequent processing system.

In the embodiment described above, the lid member 51 for the wall and the second opening mechanism 52 could be provided as separate components instead of being integral, and the N2 gas supply passage 23 and the exhaust passage 24 need not necessarily be provided. Furthermore, the resilient material is not limited to the O-ring 22 and a configuration could be used in which the pushing mechanism 45 is not provided. In addition, the configuration could be such that the positioning of the centers and orientations of the wafers W is done by the positioning mechanism 7, not the intermediate transfer stand 6, and the intermediate transfer stand 6 could be omitted. The positioning of both the centers and the orientations of the wafers W can be implemented by a combination of the turntables 72 and the mounting rings 61, for example, where both components are configured to be freely and independently elevatable.

The above-described effects are obtained if the intermediate transfer stand 6 is provided as in this embodiment, but this can also be applied to a type of system in which air is prevented from penetrating from the first environment S1 into the second environment S2 by setting the second environment S2 to a greater pressure than the first environment S1 and causing air to flow out of the second environment S2, as in the prior art.

Figure 6:
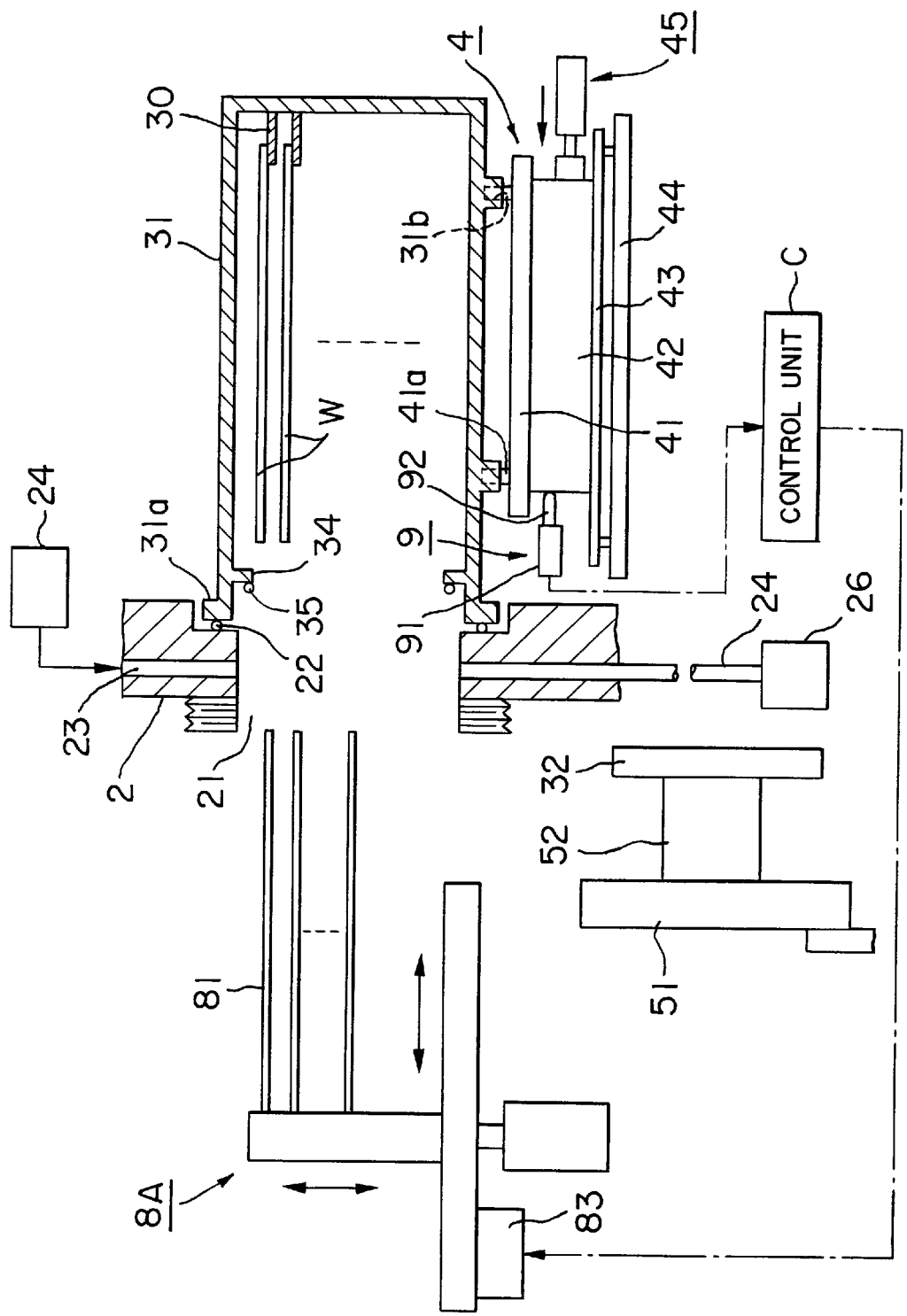
FIG. 6 is a sectional view through another embodiment of the present invention relating to a wafer cassette and wafer transporter apparatus.

A second embodiment of this invention will now be described with reference to FIG. 6. This embodiment is based on the observation that, when a wafer cassette 3 is pressed towards the step portion 21a of the aperture portion 21 for the transfer of wafers and a resilient material such as the O-ring 22 is used as a sealing member therebetween, the amount of crushing of the O-ring 22 is not stable and thus the position at which each wafer cassette 3 is fixed in the attachment/removal direction differs for each wafer cassette 3.

In other words, the position of the wafer cassette 3 is not constant which means that, even if wafers are accommodated within the wafer cassette 3 with the centers thereof aligned, the pick-up position of the wafers W within the wafer cassette 3 will differ as seen from the transporter arms 81 of the first transporter mechanism 8A. Therefore, if the stroke of the transporter arms 81 is set to be the same, the center position of the wafers W will deviate at the stage at which they have been transferred onto the transporter arms 81, making it necessary to re-position the centers. This embodiment is intended to solve this problem.

This embodiment differs from the previously described embodiment in that it is provided with a detection means 9 such as a micro-digital scale for detecting the position at which the cassette mounting portion 4 is fixed, on the forward side (the second environment S2 side) of the cassette mounting portion 4. In addition, a detection signal from this detection means 9 is input to a control means C of the first transporter mechanism 8A, a control signal from this control means C is sent to a drive means 83 of the first transporter mechanism 8A, and the stroke of the transporter arms 81 is determined on the basis of this control input signal This micro-digital scale has a configuration in which a stick 92 protrudes a predetermined distance from a main body 91, for example, and movement distances of the order of 0.1 mm can be detected by measuring the distance by which this stick 92 is pressed to protrude into the main body. With this embodiment, if the cassette mounting portion 4 stops at an initial position (the position at which the wafer cassette 3 is mounted thereon) that is just a small distance before it touches the O-ring 22, the tip of this stick 92 is disposed so as to come into contact with the forward surface of the cassette mounting portion 4. Since the position of the stick 92 is known in this configuration, the position of the cassette mounting portion 4 is also known, the detection signal from the micro-digital scale is transmitted to the control means C as position information of the wafer cassette 3, and thus the stroke of the transporter arms 81, that is, their insertion distance into the wafer cassette 3, can be controlled.

If the amount of crushing of the O-ring 22 is small and thus the movement position of the wafer cassette 3 does not reach a previously determined movement position F, as shown for example in FIG. 7(a), the insertion distance of the transporter arms 81 into the wafer cassette 3 is increased. Conversely, if the amount of crushing of the O-ring 22 is large and thus the movement position of the wafer cassette 3 exceeds the previously determined movement position F, as shown for example in FIG. 7(b), the insertion distance of the transporter arms 81 into the wafer cassette 3 is reduced.

If the insertion distance of the transporter arms 81 is controlled in this manner in accordance with the distance moved by the wafer cassette 3, and thus the reception position of the wafers W is controlled, the position of the wafers on the transporter arms 81 is always set to be the same even if the degree of crushing of the O-ring 22 differs. Therefore, the position of the centers of the wafers W is fixed, increasing the accuracy with which the wafers W are moved by the transporter arms 81 and making it unnecessary to position the centers anew.

Instead of the micro-digital scale used by way of example as the detection means 9 in the above-described embodiment, other means could be used such as a scaling device, which could be a glass scale, provided on the rails 43 of the cassette mounting portion 4, for example, in such a manner that the movement position of the cassette mounting portion 4 is detected thereby. This invention can also be applied to an apparatus that uses liquid crystal display substrates, as the substrates to be processed.

In order to reduce contamination by particles of the substrates to be processed as far as possible in the above-described embodiment, a sealed type of cassette is used for the substrates to be processed, the first environment wherein is placed the cassette of substrates to be processed is demarcated from the second environment wherein the substrates to be processed are moved, and the aperture for the attachment of the cassette of substrates to be processed is sealed. Therefore, the purity of the environment in which the substrates to be processed are placed can be kept high and thus contamination of the substrates to be processed can be prevented.

Figure 8:
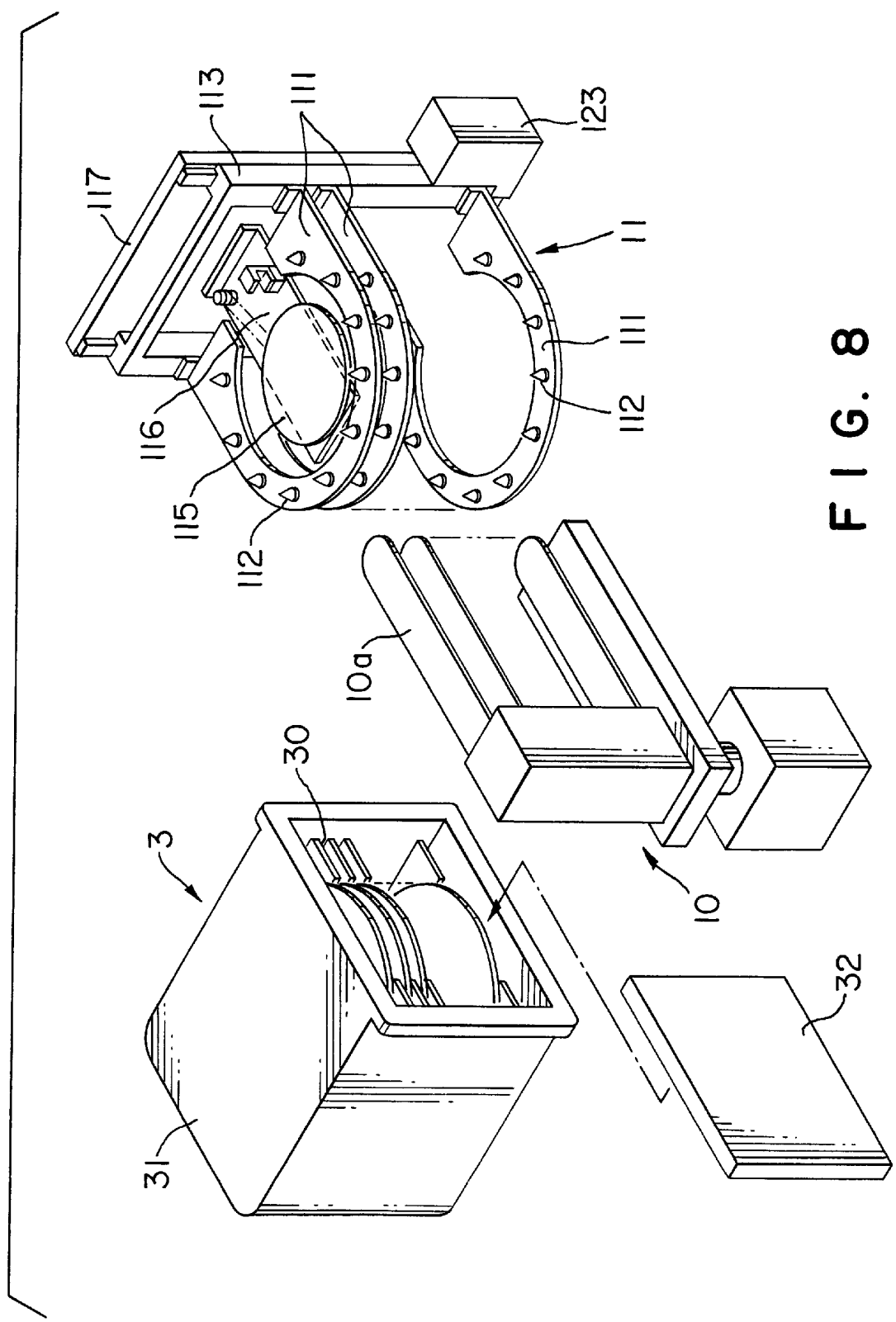
FIG. 8 is a schematic perspective view of part of a transporter station that comprises a positioning apparatus of an embodiment of this invention.

Part of a wafer transporter station that comprises the positioning apparatus of this invention is shown in FIG. 8. This transporter station is provided with a sealed type of wafer cassette 3, a wafer transporter mechanism 10, and a wafer positioning apparatus 11. The wafer cassette 3 is provided with a casing 31 in which are formed multiple stages of wafer holder grooves 30 in such a manner that a number of wafers W (for example, 13 wafers) are supported vertically at a certain spacing thereby, and a lid member 32 for hermetically sealing an aperture portion that is a wafer transfer port of this casing 31.

Figure 10:
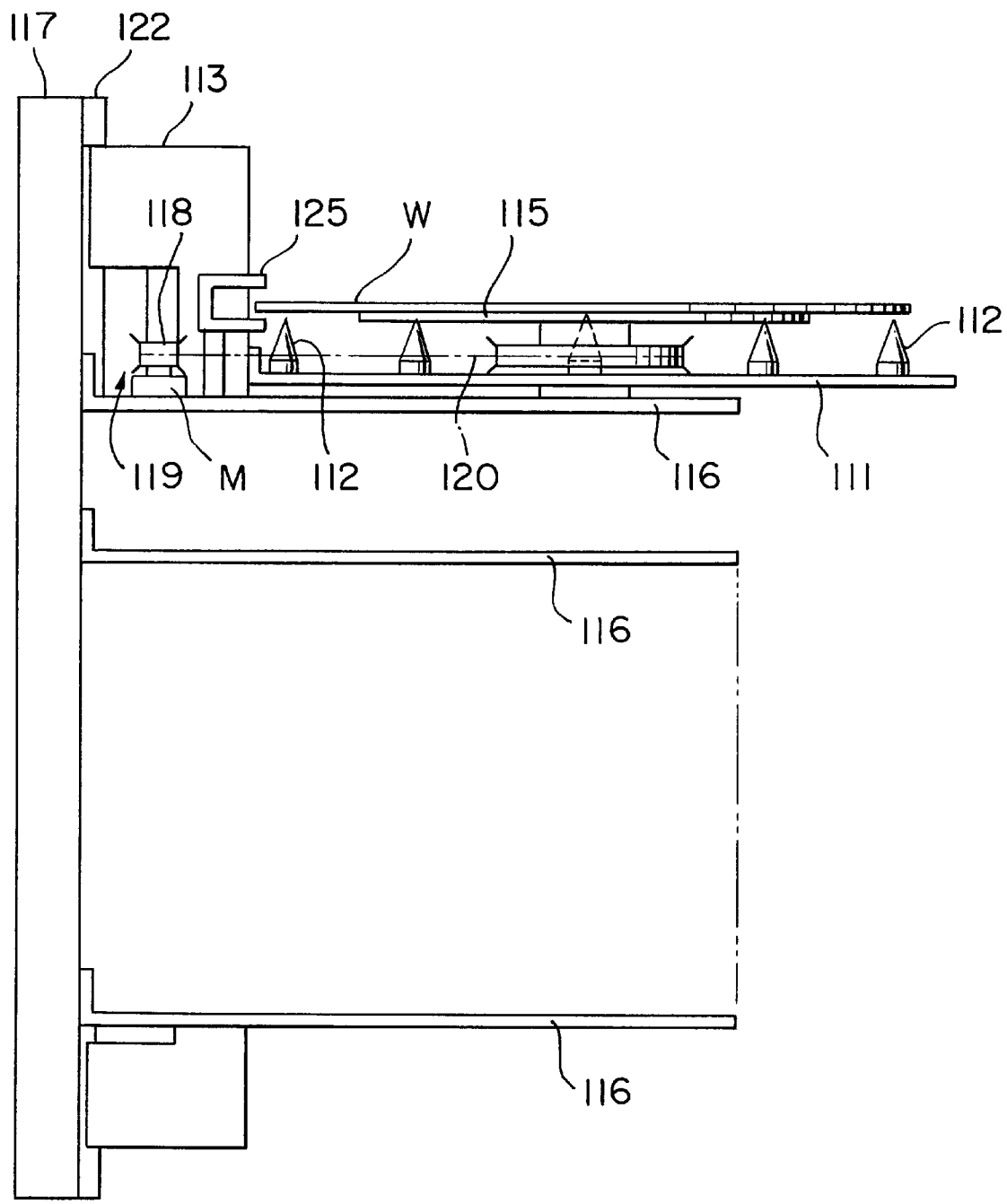
FIG. 10 is a side view of FIG. 9.

The wafer transporter mechanism 10 is designed to transfer wafers between the wafer cassette 3 and the wafer positioning apparatus 11, but the wafers could be transferred into means such as a wafer boat if the transporter station is combined with a vertical heat treatment apparatus, or into a load-lock chamber having multiple stages of wafer grooves if it is combined with a vacuum processing apparatus. This wafer transporter mechanism 10 is provided with a plurality of transporter arms 10a that are capable of transporting a plurality of wafers at a time. These arms are configured to be freely movable forward/backward, rotatably, and vertically, and the vertical spacing between the transporter arms 10a is also variable The wafer positioning apparatus 11 is provided with elevator bases 111 which are arrayed in a plurality of stages, such as five stages, and are mounting portions for positioning the centers of wafers. Each of the elevator bases 111 is a plate that is formed to be substantially annular but is cut at a base end side thereof as indicated by reference number 111a in the expanded views of FIGS. 9 and 10. The upper surface of each elevator base 111 is provided with tapered pins 112 that are inclined guide means, at positions around the peripheral edge of the wafer W. A total of ten such pins could be provided, arranged symmetrically, five to a side.

A gap is formed between the tapered pins 112 to the right and left of a tip end portion 111b of each elevator base 111 to allow one of the transporter arms 10a to be inserted therebetween, and the vertical spacing between adjacent elevator bases 111 is set to correspond to the spacing of the transporter arms 10a. The tapered pins 112 are formed of a resin such as Teflon (tradename) and each is shaped as a circular cone with a tip angle θ of 15 degrees, for example, and a height h of 20 mm, as shown in FIG. 11. The base end side of each of the elevator bases 111 is supported in common by left and right edge portions of an elevator frame 113 of a rectangular shape that extends in the vertical direction.

The positioning apparatus 11 is provided with five turntables 115 as rotational portions that each support the rear surface of a wafer and rotate horizontally. These turntables 115 are each provided on an upper portion of a fixed base 116 corresponding to each of the elevator bases 111. Each fixed base 116 is disposed slightly lower than the corresponding elevator base 111, for example, and the base end side of the fixed base 116 passes through a space surrounded by the elevator frame 113 and is fixed in common to a fixed plate 117 that is positioned on a rear surface side of the elevator frame 113.

Each fixed base 116 is provided with a drive means 119 comprising a drive pulley 118 and a motor M, for example. Each of the turntables 115 is configured so as to be capable of rotating about a vertical rotational shaft that is positioned at the center of a circular region surrounded by the tapered pins 112, driven by a transmission mechanism such as a belt 120, for example, strung from the drive pulley 118. In this example, each turntable 115 is positioned higher than the corresponding elevator base 111.

The elevator frame 113 is configured in such a manner that it can be raised and lowered by an elevator mechanism 123 (see FIG. 8) along vertical guides 122 provided on the front surface side of the fixed plate 117.

Each of the fixed bases 116 is provided with a detector portion, such as an optical sensor 125 having a light-receiving portion and a light-emitting portion, for detecting a notch 100 (see FIG. 12) or a orientation flat 200 (see FIG. 13) formed as a cut-out portion for positioning in the circular peripheral edge of a wafer W. This optical sensor 125 is disposed in such a manner that, when a wafer W is mounted on the turntable 115, a peripheral edge portion of the wafer W is sandwiched between the light-emitting portion and the light-receiving portion in the vertical direction.

A light-receiving output of the optical sensor 125 is input to a control unit 127. This control unit 127 has the function of controlling the amount of rotation (the angle of rotation) of the turntable by the drive means 119, in such a manner that the notch 100 (or the orientation flat 200) of the wafer W is orientated in a predetermined direction, on the basis of the light-receiving output.

The operation of this embodiment will now be described. It is assumed that a sealed cassette 3 has just been mounted on a cassette stage (not shown in the figures) of a wafer transporter station. The space for accommodating wafers within the cassette 3 is ordinarily hermetically shielded from the exterior by the lid member 32, in a similar manner to that shown in FIG. 2, but the lid member 32 is opened by the lid opening mechanism (not shown in the figure) for wafer transfer. The transporter arms 10a of the wafer transporter mechanism 10 are inserted into the cassette to pick up and hold five wafers W at a time from the cassette 3 and transport them into the wafer positioning apparatus 11.

Figure 14:
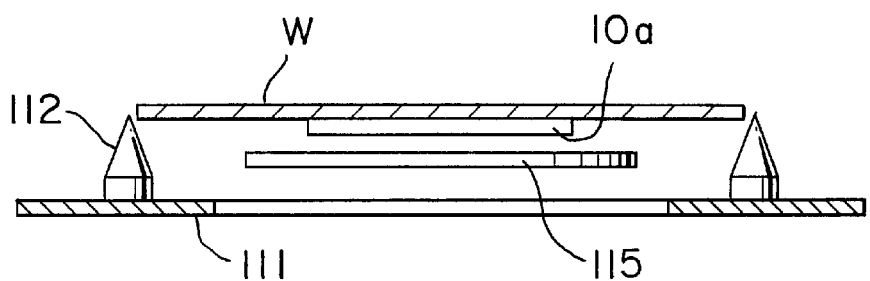
FIGS. 14(a) to 14(e) are views sequentially illustrating the state of positioning of a wafer.
Figure 14:
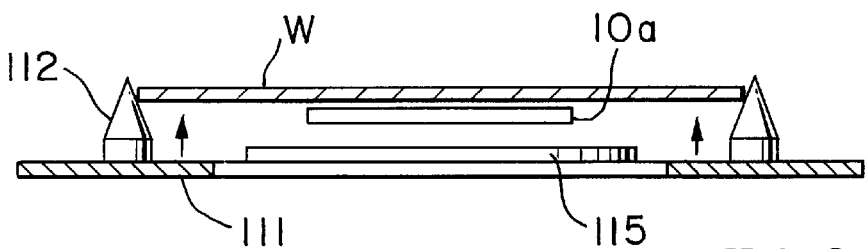
Figure 14:
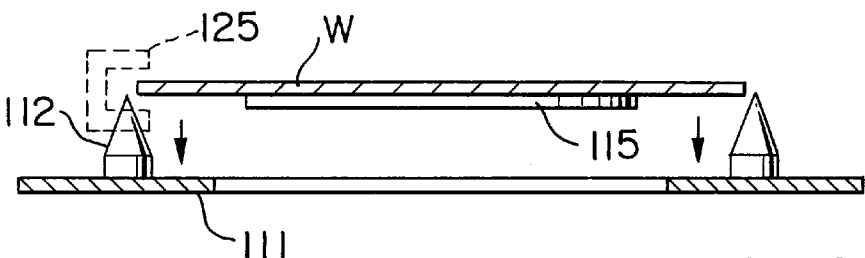
Figure 14:
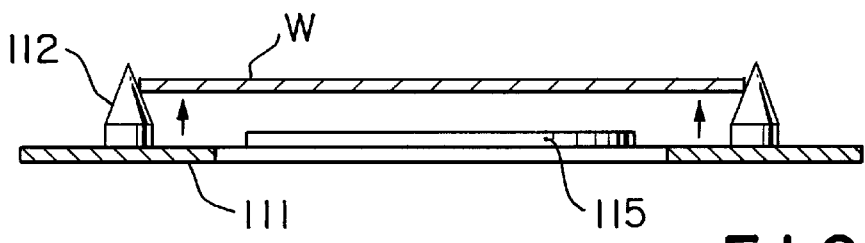
Figure 14:
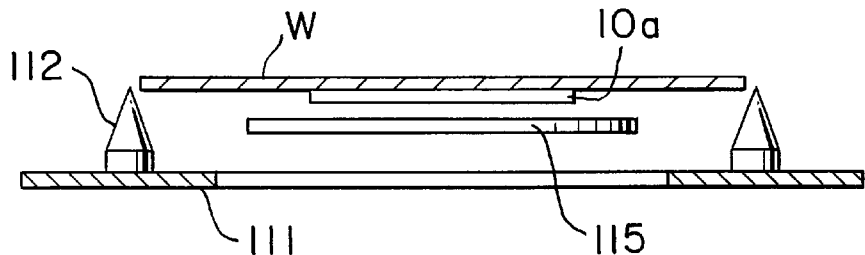

The spacing between the transporter arms 10a in the vertical direction is 10 mm, for example, when they are taking the wafers from the cassette, but it expands to 30 mm, for example, to correspond to the spacing of the elevator bases 111 when they are transferring them to the wafer positioning apparatus 11. Each of the transporter arms 10a is inserted up to a position that is, for example, 5 mm above the corresponding turntable 115, as shown in FIG. 14(a). At this point, the elevator base 111 is placed at a level of a height that positions the tapered surfaces of the tapered pins 112 below the peripheral edge of the wafer W, the elevator base 111 is raised by the rising of the elevator frame 113 so that the peripheral edge of the wafer W is supported by the tapered surfaces of the tapered pins 112 as shown in FIG. 14(b), then it is raised even further from this holding position. This lifts the wafer W off the transporter arm 10a, then the transporter arm 10a withdraws from the positioning apparatus 11.

The center of the wafer W is positioned by the support thereof by the tapered pins 112. In other words, the peripheral edge of the wafer W is regulated by the tapered surfaces of the tapered pins 112, so that if, for example, the center of the wafer W is displaced, the part of the peripheral edge thereof that is on the side to which the center is offset will come into contact with the tapered surface of a tapered pin 112 first, and the rising of that tapered surface will push the peripheral edge back in the horizontal direction. Since locations at the same height on the tapered surfaces of the ten tapered pins 112 are disposed at positions around a circle corresponding to the outer shape of the wafer W, the center position of the wafer is aligned when the wafer W is supported by all of the tapered pins 112 as shown in FIG. 14(b).

The elevator bases 111 are then lowered and the wafers W on the elevator bases 111 are transferred to the turntables 115, as shown in FIG. 14(c). Each of the turntables 115 is rotated by the drive means 119. Since the optical axis of the optical sensor 125 is set so that it passes through the cut-out portion of the wafer W, such as the notch 100, the notch 100 of the wafer W can be detected by the control unit 127 on the basis of the detection signal from the optical sensor 125, and the turntable 115 is rotated until the orientation of the wafer W reaches a predetermined position.

After the positioning of the center and orientation of each wafer W has been completed, the elevator bases 111 are raised to transfer the wafers W onto the turntables 115, as shown in FIG. 14(d). The transporter arms 10a are then inserted again between the wafers W and the turntables 115, and the transporter arms 10a are raised to transfer the wafers W from the elevator bases 111, as shown in FIG. 14(e), and transport them into a wafer boat of, for example, a vertical heat treatment apparatus.

In accordance with the above embodiment, throughput is improved because centering and orientation alignment can be performed for a plurality of wafers W at a time, which is effective for coping with the throughput problem when a sealed type of cassette 3 or the like is used. Since the centers of the wafers W are positioned by the tapered pins 112, then the wafers W are transferred from the tapered pins 112 to the turntables 115 and the orientations thereof are aligned, the configuration is simple. Furthermore, since the mechanism for positioning individual wafers is provided with several stages, a compact dedicated space will suffice therefor.

With the present invention, the configuration could be such that the bases 111 are fixed but the turntables 115 are raised and lowered, and the transporter arms 10a are raised and lowered when the wafers are transferred from the transporter arms 10a to the bases 111. However, in such a case, the transporter arms 10a are positioned above the tapered pins 112 in anticipation of the greatest deviation of the center positions of the wafers, and the wafers W are raised up from below, so that the vertical distance through which the wafers W move will increase and the size of the optical sensor 125 must be increased correspondingly. In contrast, if the bases 111 are raised and lowered, the level of the height of each wafer W is fixed until the wafers W are transferred from the transporter arms 10a to the bases 111, so that the vertical distance through which the wafers W move is small and therefore the optical sensor 125 can be made smaller in the vertical direction.

Figure 15:
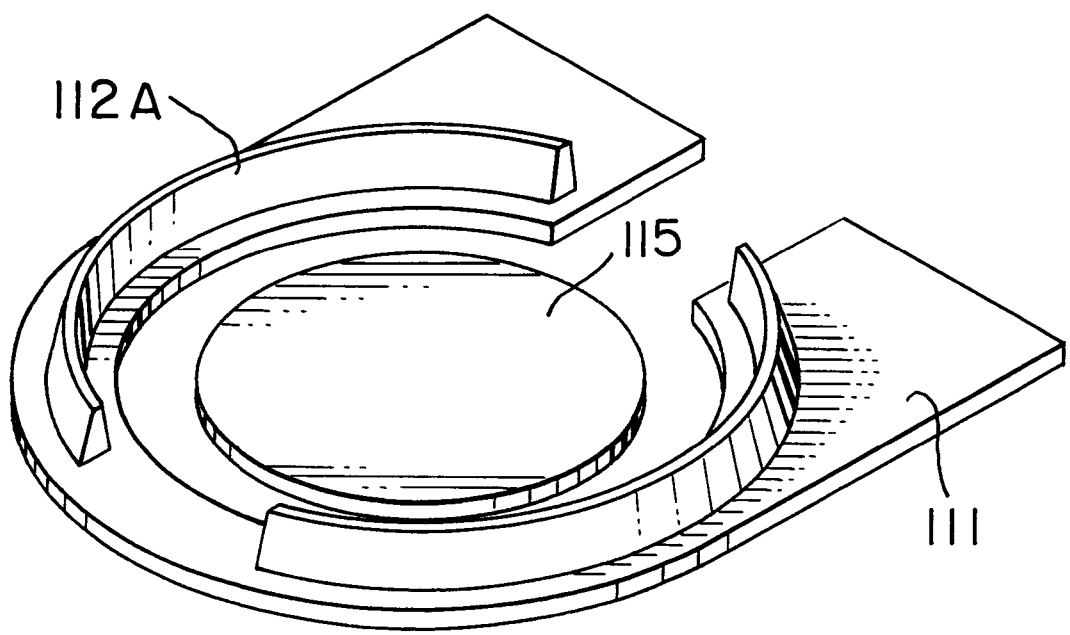
FIG. 15 is a perspective view of a variant of the tapered guide means.

Instead of the tapered pins 112 described above, the inclined guide means could be configured as a protruding portion 112A extending around the periphery, with the inner peripheral side thereof formed as an inner tapered surface that is inclined in such a manner that it separates from the wafer with increasing height, as shown in FIG. 15, so that the entire peripheral edge of the wafer (except for locations corresponding to insertion spaces for the transporter arm, etc.) is supported thereby. Furthermore, the positioning mechanism of this invention, comprising components such as the bases 111 and turntables 115, could equally well be provided as a single stage instead of a number of stages.

A further embodiment of the present invention will now be described with reference to FIGS. 16 and 17. This embodiment concerns an apparatus for positioning wafer centers while the wafers are accommodated within a wafer cassette. A standard cassette tested under the rules of, for example, the Semiconductor Equipment and Materials Institute (SEMI) is used as the cassette. In these figures, reference number 130 denotes a wafer cassette that is placed in a lateral orientation on a cassette mounting stand 131, which is a cassette mounting portion, so that wafers W are arranged substantially horizontally. In this lateral orientation of the wafer cassette 130, an upper surface plate 132 and a lower surface plate 133 are formed to be substantially circular and slightly larger than the outer edge of the wafers W, and front edges 132a and 133a of these plates 132 and 133 are formed to a circular arc shape of close to the same radius as that of the outer edge of the wafers W. Side walls 135 and 136 are formed along the peripheral edges of the plates 132 and 133 between the plates 132 and 133 and on the left and right sides thereof, a wall portion 137 is also formed at a rear portion between the plates 132 and 133, and 13 support grooves 138 are formed on the inner peripheral surfaces of these wall portions 135, 136, and 137 to support each of the peripheral edges of 13 wafers.

The space between the arc-shaped front edges 132a and 133a of these plates 132 and 133 is formed as an aperture 140 that acts as a port for removing and inserting wafers W. Similarly, portions are cut out of the left and right sides at the rear of the walls 135 and 136 to form apertures 140 between the plates 132 and 133 (see FIG. 17). The apertures 140 are not really visible in FIG. 17.

Pushing mechanisms 150A and 150B are provided symmetrically on the left and right sides of the cassette 130 for pressing against the peripheral edge portions of the wafers in the cassette 130. The positioning mechanism of this embodiment of the invention is configured of these pushing mechanisms 150A and 150B. The pushing mechanisms 150A and 150B have the same construction. Pushing members, such as rotatable rollers 142 rotating about vertical shafts 141 are provided at positions opposite to the peripheral edge portions of the wafers W where they are exposed in the vicinity of the left and right side edges of the aperture 140 of the cassette 130, that is, at positions opposite to regions facing the front edge surfaces of the walls 135 and 136.

Each of the rollers 142 is divided into sections for each wafer W, corresponding to the wafers W within the cassette, so that the same number of roller elements 142a as the number of wafers W in the cassette, such as 13, are arrayed in the heightwise direction to correspond to the heightwise positions of the wafers W. Spacer members that cannot be seen in the figures are threaded onto each shaft 141 between the roller members 142a, to maintain the spacing between the roller members, so that the roller members 142a can rotate independently without rubbing against each other.

Rollers 145 that are similar to the rollers 142 and are free to rotate about vertical shafts 144 are also provided at positions opposite to the apertures 141 formed to the left and right of the rear side of the cassette 130. Lower end portions of the shafts 141 and 144 of these rollers 142 and 145 are fixed to common sliding plates 148. The upper ends of these shafts 141 and 144 are connected together by linking members 147.

The sliding plates 148 are configured to be free to move forwards and backwards in a direction perpendicular to a center line L linking the front and rear of the cassette 130 (so that they move to the left and right in FIG. 16), while being guided along guide rails 150 and 151. A drive portion such as an air cylinder 152 is provided on a side portion of each sliding plate 148 for moving that sliding plate 148 forwards and backwards. The four rollers 142 and 145 of the pressuring mechanisms 150A and 150B are positioned in such a manner that they are in contact with the peripheral edges of the wafers W when the centers of the wafers W in the cassette 130 are aligned. A material such as Teflon (tradename) is used for the rollers 142 and 145.

With the above-described embodiment, a cassette 130 containing 13 wafers W, for example, is placed laterally on the cassette mounting stand 131 of a cassette entrance/exit port of a vertical heat treatment apparatus or the like. At this point, the rollers 142 and 145 of the transporter mechanism are moved back to positions where they do not impede the cassette 130. After the cassette 130 has been placed on the mounting stand 131, the sliding plates 148 are moved forwards by the air cylinders 152 to press the rollers towards the direction of the centerline L at four locations on the peripheral edge portions of the wafers exposed from the apertures 140 and 141 of the cassette 130, whereby the centers of all of the wafers W within the cassette 130 are simultaneously positioned. The rollers 142 and 145 then move back and conveyor arms (not shown in the figures) start removing the wafers W within the cassette 130.

Figure 17:
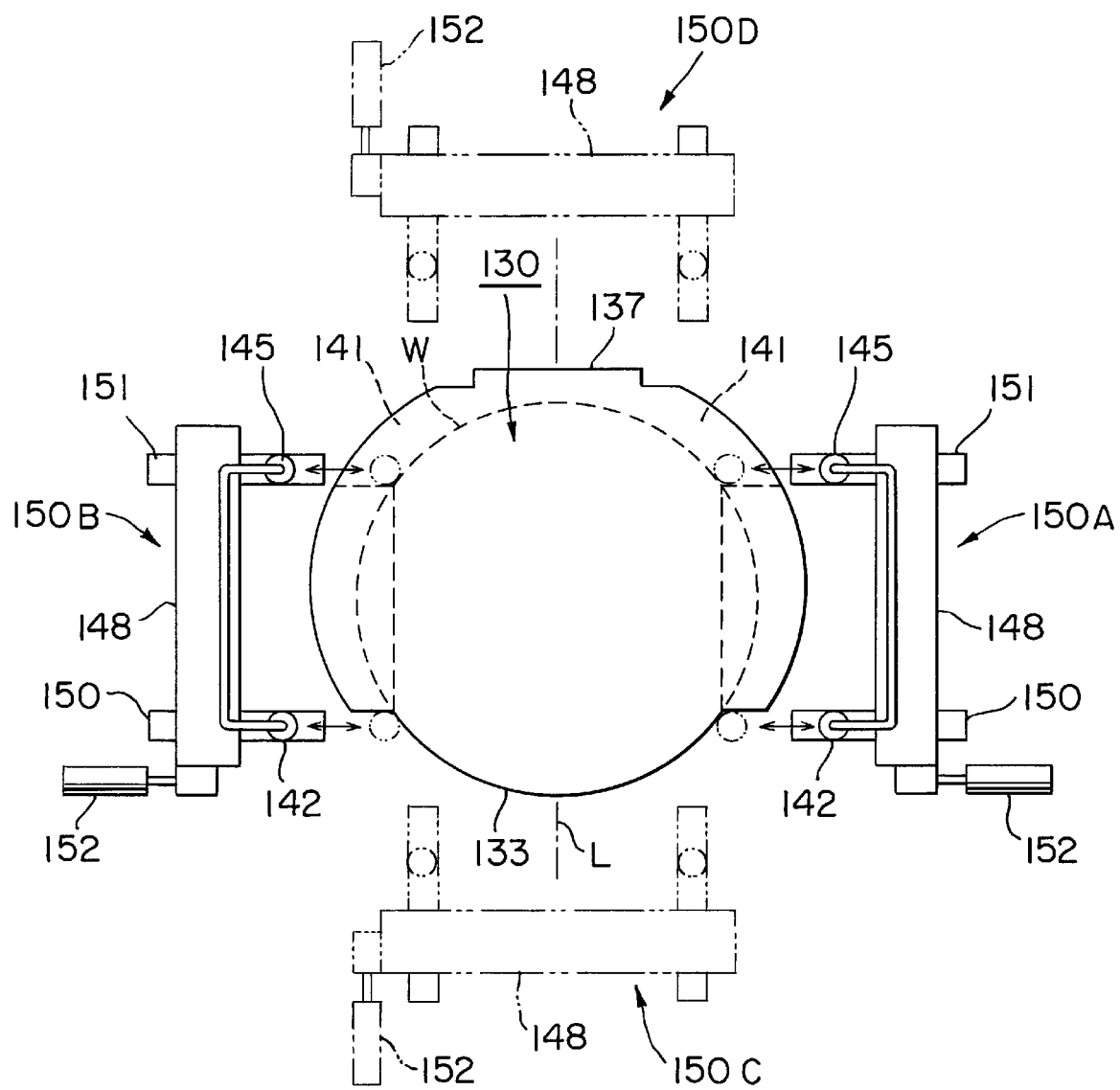
FIG. 17 is a plan view of the positioning apparatus of FIG. 16.

This pair of pushing mechanisms 150A and 150B are disposed facing towards the left and right in FIG. 17, but the same positioning effect could be obtained by a pair of pushing mechanisms 150C and 150D disposed at the top and bottom of the paper in FIG. 17.

In the embodiment described above, the center positioning can be performed for all of the wafers W within the cassette 130, thus making it possible to improve the throughput. This embodiment is effective because the previously mentioned standard cassette is fabricated to dimensions with tolerances concerning wafer size and thus the permissible positioning accuracy of the centers of the wafers is only the order of within a circular region of diameter 4 mm. For processing in which the orientation of the wafers is not too critical, the wafers within the cassette can be transferred as they are into the processing station. Alternatively, if accurate alignment of the wafer orientation is required, alignment of the wafer orientation alone can be performed subsequently, so that a simple mechanism will suffice for the positioning.

Note that the members that press against the peripheral edges of the wafers are not limited to rollers, but the use of rollers makes it possible to suppress the generation of particles due to friction because the rollers rotate when tangential forces are applied thereto during the pushing. In addition, a single roller could be used in common for all of the wafers, but the use of rollers that are separated for each of the wafers means that they can rotate independently in answer to any deviation in the central position of individual wafers, enabling a further suppression of friction between the rollers and the wafer edges.

It should be noted that the type of cassette is not limited to the standard cassette shown in FIG. 7. Similarly, the pressuring of the wafer edges could be done at three or more locations; it is not limited to four locations.

The above description concerned the positioning of wafers accommodated within a cassette, but the principles described herein can also be used for centering a wafer that is mounted on a notch aligner device.

Since the present invention combines a rotational mounting portion with a mounting portion that is provided with a tapered portion and is used to center a wafer, it enables positioning of the center and orientation of a wafer by a simple configuration. It is also possible to position a plurality of wafers a time, by providing a plurality of stages of the positioning mechanism formed of these mounting portions. Since the apparatus is configured in such a manner that the peripheral edges of wafers exposed from a wafer cassette are pushed in at least three locations, centering can be performed on wafers within the wafer cassette.

What is claimed is:

1. An apparatus for aligning a central position and a rotational position of a substrate to be processed, the substrate having a peripheral edge forming a circle and a cut-out portion for rotational position detection formed in the peripheral edge; said apparatus comprising:

a turntable rotatable about a vertical rotational axis and having an upper surface on which a substrate to be processed is mounted;

detection means for detecting the cut-out portion of the substrate while the substrate is mounted on and rotating with said turntable;

control means for controlling an amount of rotation of said turntable in accordance with a detection signal from said detection means, to align the rotational position of the substrate;

a substantially annular horizontal base provided around said turntable for receiving the substrate thereon, said horizontal base being movable vertically relative to said turnable; and inclined guide means rising from an upper surface of said base and provided along the circular peripheral edge of the substrate which is mounted on said base in such a manner that the peripheral edge of the mounted substrate comes into contact with said guide means and is guided thereby, said inclined guide means being formed of a plurality of tapered pins raised along a circle on said upper surface of said base, each pin being of a diameter that decreases toward an upper end thereof.

2. The apparatus for positioning a substrate to be processed as defined in claim 1, wherein said inclined guide means on said horizontal base is partially removed to configure an insertion gap for a transportation arm for conveying the substrate to be processed onto said base and from said base.

3. The apparatus for positioning a substrate to be processed as defined in claim 1, wherein said inclined guide means is capable of being raised and lowered with respect to said turntable, in such a manner that the substrate to be processed is transferred to or from said turntable.

4. The apparatus for positioning a substrate to be processed as defined in claim 1, wherein said turntable is provided on an outer periphery of said inclined guide means of said base, and a transportation arm is provided between said base and said turntable.

5. The apparatus for positioning a substrate to be processed as defined in claim 1, further comprising:

an upstanding fixed plate; and a horizontally extending fixed base having a proximal end secured to said fixed plate and rotatably supporting said turntable thereon.

6. The apparatus for positioning a substrate to be processed as defined in claim 5, wherein said detection means is provided on said fixed plate.

7. The apparatus for positioning a substrate to be processed as defined in claim 5, wherein said horizontal base is movable vertically relative to said fixed base and has a cut portion corresponding in position to said proximal end of said fixed base.

* * * * *